(12) United States Patent
Frei et al.

(10) Patent No.: US 9,077,316 B2
(45) Date of Patent: Jul. 7, 2015

(54) TRANSMITTER FINITE IMPULSE RESPONSE CHARACTERIZATION

(71) Applicant: Oracle International Corporation, Redwood City, CA (US)

(72) Inventors: James Michael Frei, Sunol, CA (US); Jyotika Singh, Santa Clara, CA (US); Stephen Andrew Muller, Santa Clara, CA (US); Ryan Travis Caldwell, San Diego, CA (US)

(73) Assignee: Oracle International Corporation, Redwood City, CA (US)

( * ) Notice: Subject to any disclaimer, the term of this patent is extended or adjusted under 35 U.S.C. 154(b) by 262 days.

(21) Appl. No.: 13/716,840

(22) Filed: Dec. 17, 2012

(65) Prior Publication Data

US 2014/0172935 A1   Jun. 19, 2014

(51) Int. Cl.
  *G06F 17/10* (2006.01)
  *H03H 17/06* (2006.01)
  *H03H 17/00* (2006.01)

(52) U.S. Cl.
  CPC ....... *H03H 17/06* (2013.01); *H03H 2017/0081* (2013.01)

(58) Field of Classification Search
  None
  See application file for complete search history.

(56) References Cited

U.S. PATENT DOCUMENTS

| 5,159,565 | A  | * | 10/1992 | Bune | 708/319 |
| 5,561,687 | A  | * | 10/1996 | Turner | 375/233 |
| 6,370,556 | B1 | * | 4/2002 | Saramaki et al. | 708/319 |
| 2010/0208855 | A1 | * | 8/2010 | Huang et al. | 375/354 |
| 2014/0172935 | A1 | * | 6/2014 | Frei et al. | 708/317 |
| 2014/0241477 | A1 | * | 8/2014 | Eliaz | 375/348 |

OTHER PUBLICATIONS

Le Croy, Eye Doctor II, Advanced Signal Integrity Tools, EyeDoctorIIDS—Nov. 22 Oct. 2010.
Agilent N4916B De-emphasis Signal Converter, Data Sheet, Version 1.1, www.agilent.com/find/n4916, printed on Dec. 17, 2012.

* cited by examiner

*Primary Examiner* — David H Malzahn
(74) *Attorney, Agent, or Firm* — Brooks Kushman P.C.

(57) ABSTRACT

A finite impulse response (FIR) extractor includes at least one controller. The controller injects specified FIR tap values into a first captured waveform that results from transmitting a raw waveform through a transmitter circuit including a FIR filter having pre and post cursor tap values set to zero to create an expected waveform, and injects the specified FIR tap values into the raw waveform to create an ideal waveform. The controller further projects the expected and ideal waveforms onto a second captured waveform that results from transmitting the ideal waveform through the transmitter circuit with the pre and post cursor tap values set to the specified FIR tap values to create a compensated waveform, and extracts FIR tap values from the compensated waveform.

20 Claims, 4 Drawing Sheets

US 9,077,316 B2

TRANSMITTER FINITE IMPULSE RESPONSE CHARACTERIZATION

TECHNICAL FIELD

This disclosure relates to high-speed transmitter characterization.

BACKGROUND

In signal processing, a finite impulse response (FIR) filter has an impulse response of finite duration. Infinite impulse response (IIR) filters, in contrast, may have internal feedback and may continue to respond indefinitely.

FIR filters may have several useful properties: (a) They require no feedback. Hence, rounding errors are not compounded by summed iterations. The same relative error occurs in each calculation. (b) They are inherently stable. Because there is no required feedback, all poles are located at the origin and thus within the unit circle. (c) They can be designed to have linear phase (or phase change proportional to frequency) by setting the coefficient sequence to be symmetric. Such may be desirable for phase-sensitive applications such as data communications, crossover filters, and mastering.

SUMMARY

Estimating finite impulse response (FIR) of a FIR filter includes injecting specified FIR tap values into a first captured waveform that results from transmitting a raw waveform through a transmitter circuit including the FIR filter having pre and post cursor tap values set to zero to create an expected waveform, and injecting the specified FIR tap values into the raw waveform to create an ideal waveform. Estimating the FIR further includes projecting the expected and ideal waveforms onto a second captured waveform that results from transmitting the ideal waveform through the transmitter circuit with the pre and post cursor tap values set to the specified FIR tap values to create a compensated waveform, and extracting FIR tap values from the compensated waveform. Estimating the FIR may further include extracting a cursor tap value from the second captured waveform. Extracting FIR tap values from the compensated waveform may include aligning the compensated and ideal waveforms in time. Injecting specified FIR tap values into a first captured waveform may include convolving the specified FIR tap values and first captured waveform. Injecting the specified FIR tap values into the raw waveform may include convolving the FIR tap values and raw waveform. Projecting the expected and ideal waveforms onto a second captured waveform may include taking the product of the second captured waveform and the quotient of the ideal and expected waveforms. The raw waveform may be a repeating waveform.

DETAILED DESCRIPTION

Figure 1:
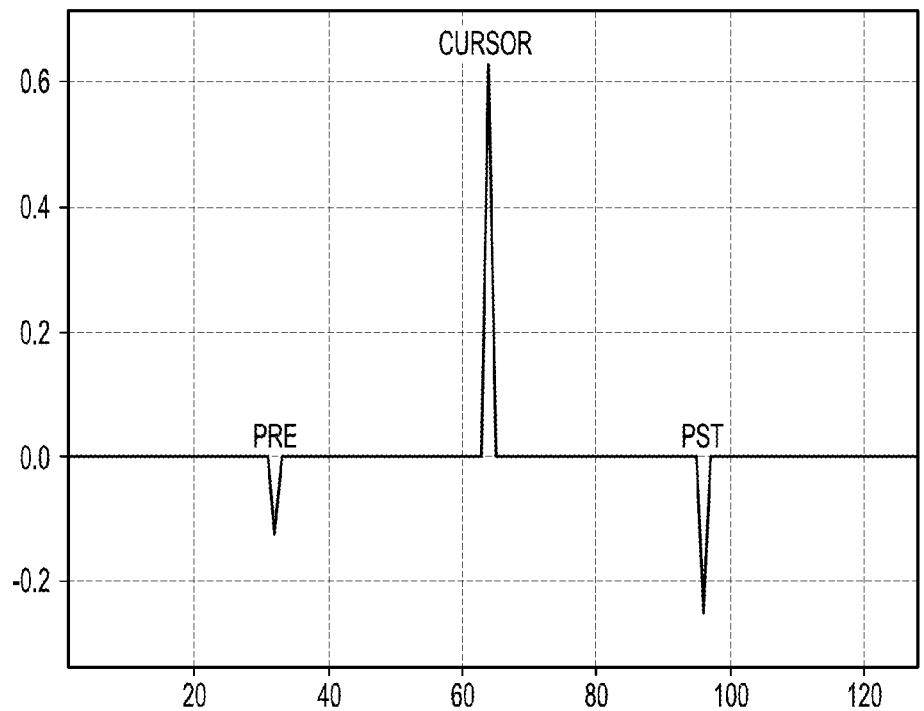
FIG. 1 is a plot of finite impulse response (FIR) taps.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

In many high speed signal applications, finite impulse response (FIR) pre-compensation is necessary to improve signal integrity and prevent data corruption. Thus, characterizing the FIR output of a transmitter including a FIR filter may become important in design. Accurately measuring the FIR at the output is problematic when there are lossy microstrips, striplines, cables, connectors, and other transmission lines needed to connect the output of the transmitter to a scope. These lossy transmission lines cause undesired distortions in the signal, effectively misshaping it such that the FIR measured at the scope does not reflect the true FIR transmitter output.

Certain algorithms described herein may compensate for the bandwidth limitations of the FIR measurement by, for example, computing the convolved FIR tap values from a waveform with no FIR, dividing the resultant convoluted waveform from the measured waveform, and multiplying it by the ideal waveform. This could be implemented as a feature on a machine (scope) that can be enabled with, for example, the push of a button that would then extract the FIR taps and transpose them onto the ideal waveform.

FIR Basics

The output, y', of a linear time invariant system is determined by convolving its input signal, y, with its impulse response, h:

$$y' = y * h \quad (1)$$

This is the simplest form of a FIR. The impulse response, h, can be something other than unity and is known as the cursor height. (Changing this height can be used to set transmitter output swing values.)

Generally, FIR can be represented as a series of δ functions:

$$h = \delta \cdot pre_{x-1} + \ldots + \delta \cdot pre_1 + \delta \cdot cur + \delta \cdot pst_{x-1} + \ldots + \delta \cdot pst_x \quad (2)$$

where $$y = \delta * y \quad (3)$$

and the numbered positions of pre and pst are the FIR cursor taps. The position of these taps corresponds to the transition regions in which a logical "1" changes to a logical "0" and a logical "0" changes to a logical "1." (FIR affects only the fast transitional states and not the stable low-frequency regions.)

(3) may be simplified to $$h = \delta(t+1_{[UI]}) \cdot pre_1 + \delta(t) \cdot cur + \delta(t-1_{[UI]}) \cdot pst_1 \quad (4)$$

which is graphically depicted in FIG. 1. It is often difficult to extract the tap values when in the form shown in FIG. 1. In practice when in this form, the waveform is usually convolved with a unity pulse having a width of 1 UI as shown in FIG. 2.

Figure 2:
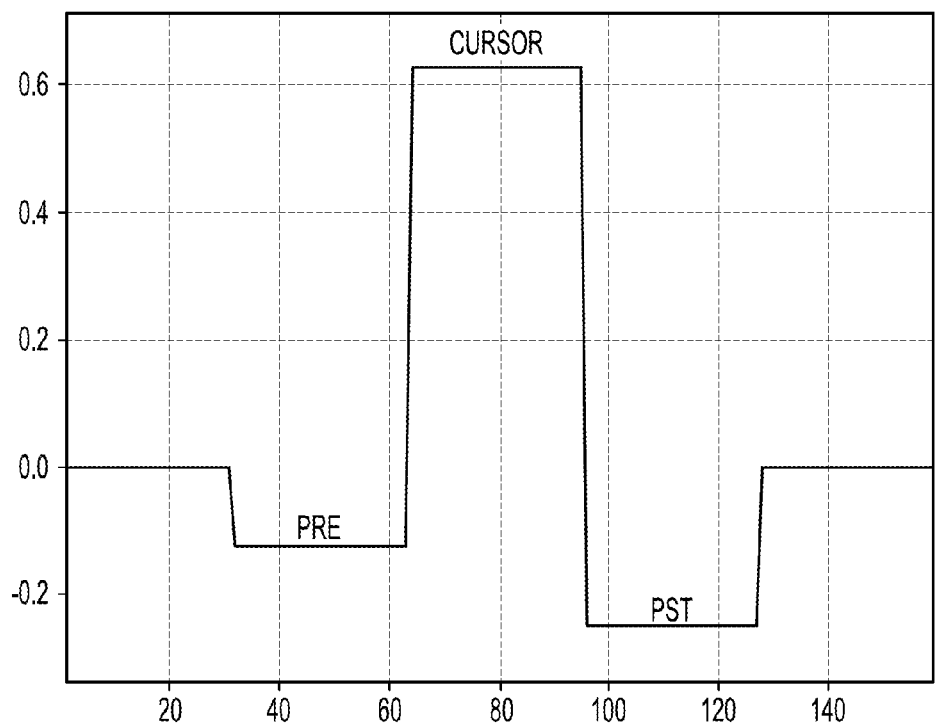
FIG. 2 is a plot of the pulse response of FIG. 1.

The flat stable regions illustrated in FIG. 2 are the exact tap heights in an ideal case and can be easily measured. (If either the system impulse response or the system pulse response is known, the FIR taps can be extracted.) As mentioned previously, this form is preferred in practice since under non-ideal conditions the resolution is not sufficient to yield fast rise and fall transition times. Furthermore, computational statistical error is present in the resultant output.

Characterizing FIR Output—Traditional Techniques

One of two methodologies is typically used to characterize and measure the FIR output. The first technique de-embeds the transmission lines by measuring the S-parameter of the undesired cables and traces. This can be realized by dividing the Fast Fourier transform (FFT) of the measured waveform, $y_{[measured]}$, by the insertion loss portion of the S-parameter, $S_{21}$. An inverse Fast Fourier transform (IFFT) of the result yields the de-convolved waveform, $y_{[de\text{-}embedded]}$. This can be represented as $$y_{[de\text{-}embedded]} = IFFT\left\{\frac{FFT\{y_{[measured]}\}}{S_{21}}\right\} \quad (5)$$

It, however, can be difficult to accurately measure the S-parameter because there is often no way to access the exact traces and connectors, there is no way to isolate the traces causing undesired capacitances, and the probes used to measure the traces produce undesired interference with the measurement. Also, there are other loss components that cannot be accounted for in the S-parameter measurement. These include the bandwidth limitations of the transmitter circuitry itself: The transmitter circuitry is composed of capacitors, inductors, traces, etc., and each has a bandwidth limitation and corresponding loss profile. Such is inherent to the circuit design and cannot be removed with a S-parameter measurement.

In order to characterize inaccessible traces, designers may include test structures that mimic these traces. These test structures are a representation of what the actual transmission line should be and are designed to facilitate S-parameter measurements. The obvious dilemma is that in these cases one may not have an accurate measurement/model of the S-parameter which may invalidate the FIR de-embedded waveform.

The second technique to measure and characterize FIR output attempts to compensate for the bandwidth by measuring a pattern waveform of large transitional states with and without FIR. This method divides the FFT of the waveform with FIR, $y_{[with\,FIR]}$, by the FFT of the waveform without FIR, $y_{[no\,FIR]}$. An IFFT of the result is the system impulse response, $h_{[de\text{-}embedded]}$. This can be represented as $$h_{[de\text{-}embedded]} = IFFT\left\{\frac{FFT\{y_{[with\,FIR]}\}}{FFT\{y_{[no\,FIR]}\}}\right\} \quad (6)$$

Convolving the system impulse response with a pulse of 1 UI yields the FIR tap settings.

This second technique has several benefits: (a) All of the taps can be extracted. (b) The traces, connectors, etc. in both captured waveforms are measured. (c) Since the waveforms are divided in the frequency domain, the impulse response only contains the FIR. (d) No test structures or S-parameter measurements are needed.

Figure 3:
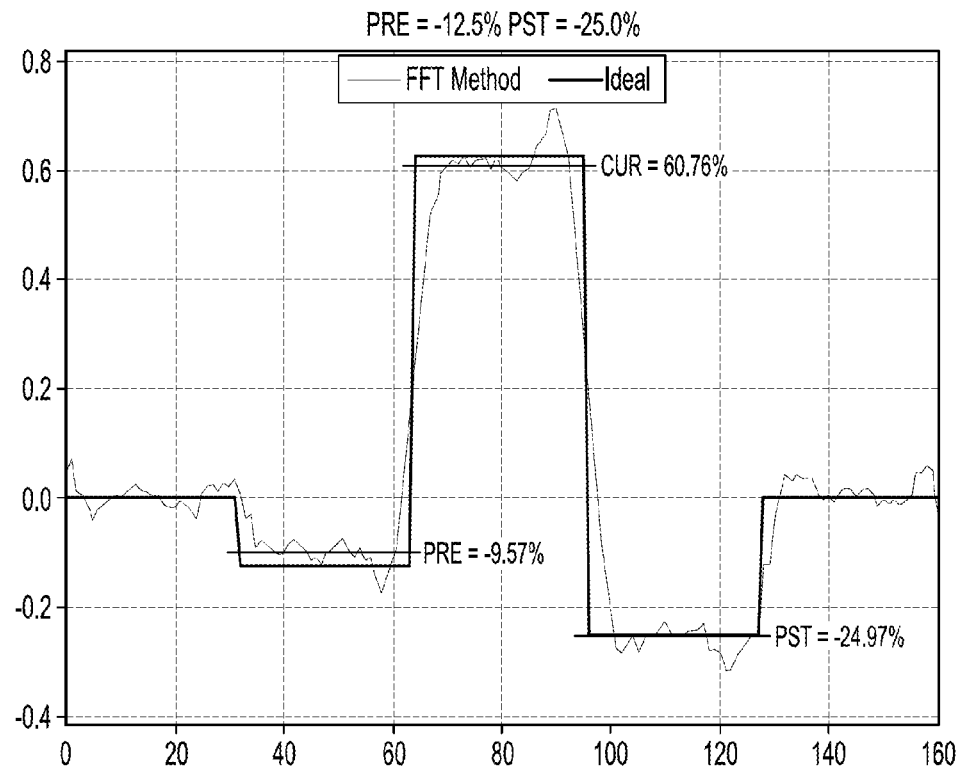
FIG. 3 is a plot of the pulse response calculated from the impulse response Fast Fourier transform method for a PRBS7 pattern.

There are also, however, several drawbacks: (a) Patterns containing many transitional states are necessary. This is driven by the FFT algorithm. Essentially, the FFT is a numerical approximation that attempts to approximate the Fourier equivalent of the harmonics of the waveform. Hence, many transitional states are needed to provide sufficient resolution for a clean measurement. (b) A relatively long time is needed to achieve good resolution. Many transitional states require a larger pattern waveform. In practice, a PRBS7 waveform (127 bits) is necessary for acceptable resolution, although a PRBS15 waveform ($2^{15}-1$ bits) yields much better results. FIG. 3 shows the results using a PRBS7 pattern. The slower rise and fall transition times are not caused by bandwidth limitations. Rather, they result from lower resolution from insufficient transition states. Capturing a larger PRBS pattern may yield faster rise time edges that are closer to ideal. It takes seconds to capture a PRBS7 pattern from a sampling scope whereas it takes minutes to capture a PRBS15 waveform from the same scope. (c) The FFT algorithm introduces noise into the results. (d) There is no differentiation in the FIR tap values between the rising and falling edges.

Characterizing FIR Output—Bandwidth Compensation Technique

Algorithms for characterizing and measuring FIR output that may be simpler, faster, and cheaper than other viable methods are disclosed herein. Furthermore, these algorithms can be implemented into the software of currently existing scopes and may provide a graphical user interface that displays the swing and FIR values for an ideal waveform (infinite bandwidth), an "idealistic" waveform (expected waveform based on tap values), and the measured waveform. Additional displays may include a display of the compensated waveform (bandwidth limitations removed) and the ideal waveform.

In the following example, a repeating eight-ones-eight-zeros pattern, $y_{[raw]}$, is used with an oversampling rate of 32 points per bit. This pattern consists of eight logic level "1's" for the first eight bits and eight logic level "0's" for the last eight bits. The total pattern length is 16 bits and repeats after the $16^{th}$ bit. The algorithms described herein, however, will work with any size waveform pattern and are not limited to the eight-ones-eight-zeros pattern. The pattern of the following example was chosen for reasons related to simplicity and speed since it provides a minimum number of transitional states (rise and fall) with long stable regions in which capacitors can saturate and reach steady state. Furthermore, any transmitter with FIR should be able to transmit such a pattern or one similar.

Figure 4:
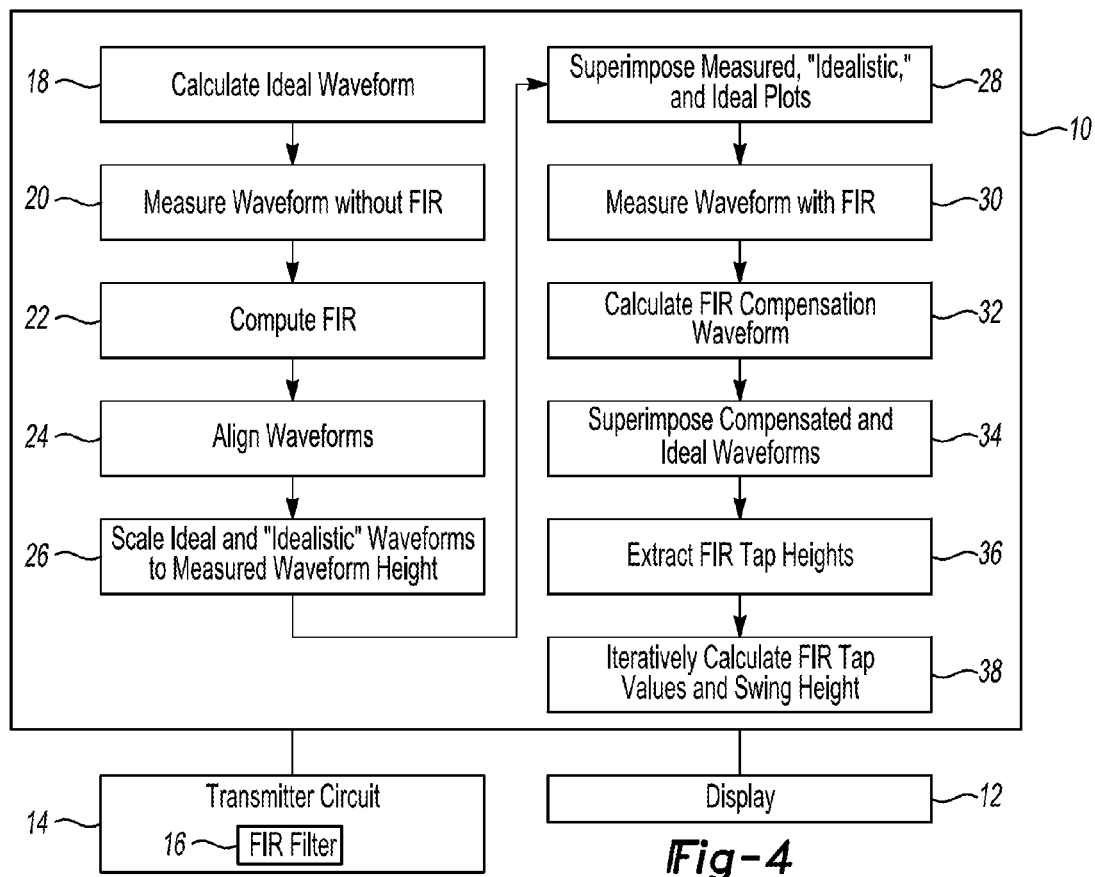
FIG. 4 is a flow chart of an algorithm for characterizing FIR output.

With reference to FIG. 4, a controller (or controllers) 10 is operatively arranged with a display 12 and a transmitter circuit 14 including a FIR filter 16. At operation 18, an ideal waveform, $y_{[ideal]}$, which has infinite bandwidth, is calculated at operation 10 by convolving (injecting) the eight-ones-eight-zeros pattern, $y_{[raw]}$, with specified FIR tap values, $h_{[FIR\ taps]}$. This can be represented as $$y_{[ideal]} = y_{[raw]} * h_{[FIR\ taps]} \quad (7)$$

The results resemble a clean square pulse (see e.g., FIG. 5), in which the transition region is very short—corresponding to the fastest rise and fall times possible.

At operation 20, the eight-ones-eight-zeros waveform is measured without FIR under "best case" conditions including all connectors, traces, etc. That is, the eight-ones-eight-zeros waveform is transmitted through the transmitter circuit 14 including the FIR filter 16 with its pre and post cursor tap values set to zero, and the resulting output, $y_{[no\ FIR]}$, is then captured. This "best case" measurement of no FIR is a baseline measurement and contains all of the bandwidth information.

At operation 22, the FIR present is computed by convolving the measurement from operation 20 with the FIR tap values. This can be represented as $$y_{[idealistic]} = y_{[no\ FIR]} * h_{[FIR\ taps]} \quad (8)$$

The resultant convolved waveform, $y_{[idealistic]}$, is the "idealistic" or expected waveform.

At operation 24, the waveforms are aligned such that the first eight "0's" of the measured waveform correlates to the first eight "0's" of the "idealistic" waveform. At operation 26, the ideal and "idealistic" waveforms are scaled to the measured waveform height. Care should be taken when scaling to ensure that singularities are removed. Thus in many instances, the waveforms should be shifted away from any zero points. Otherwise, division by zero is possible—resulting in artifacts.

Figure 5:
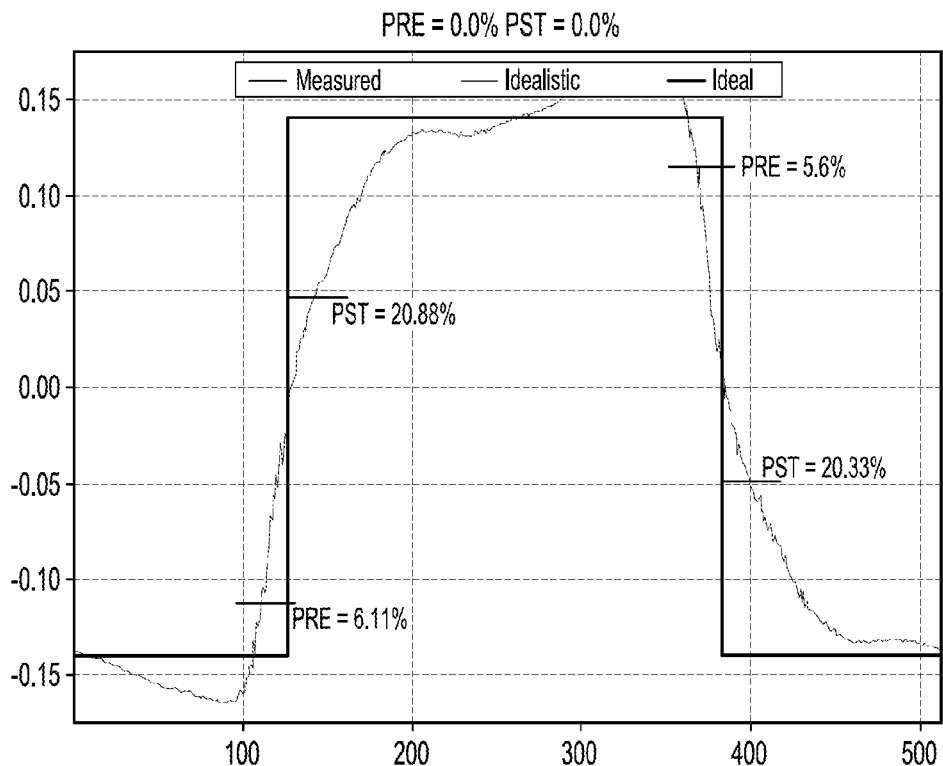
FIG. 5 is a plot of a bandwidth limited eight-ones-eight-zeros pattern contrasted with an ideal pattern, which is not bandwidth limited.
Figure 6:
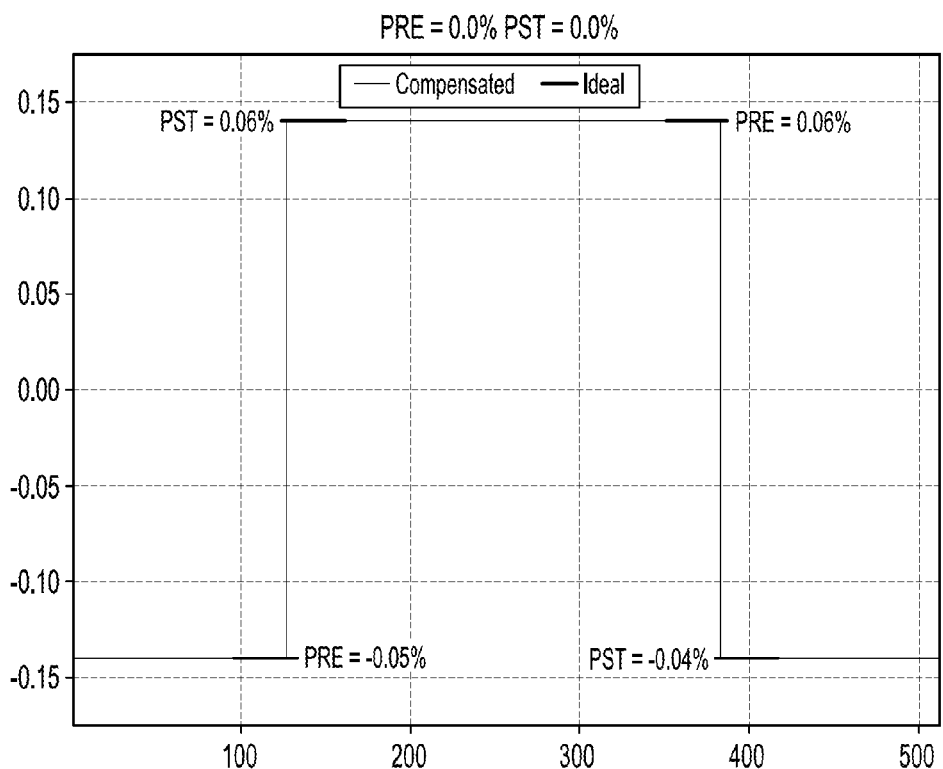
FIG. 6 is a plot of no-FIR compensated and ideal waveforms.
Figure 7:
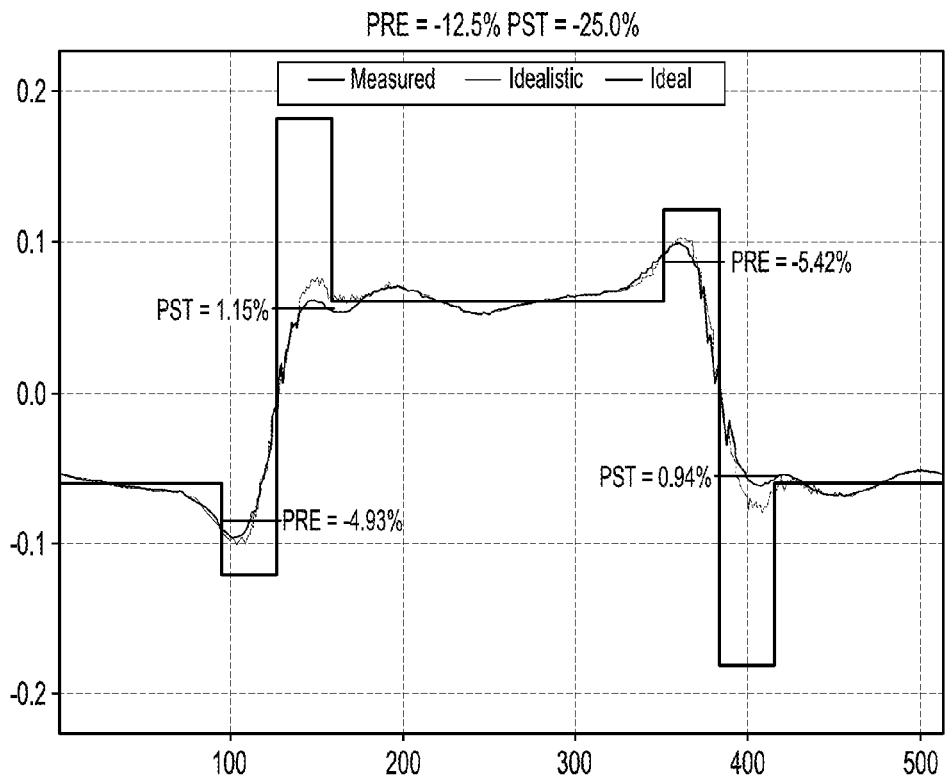
FIG. 7 is a plot of measured, idealistic and ideal waveforms.
Figure 8:
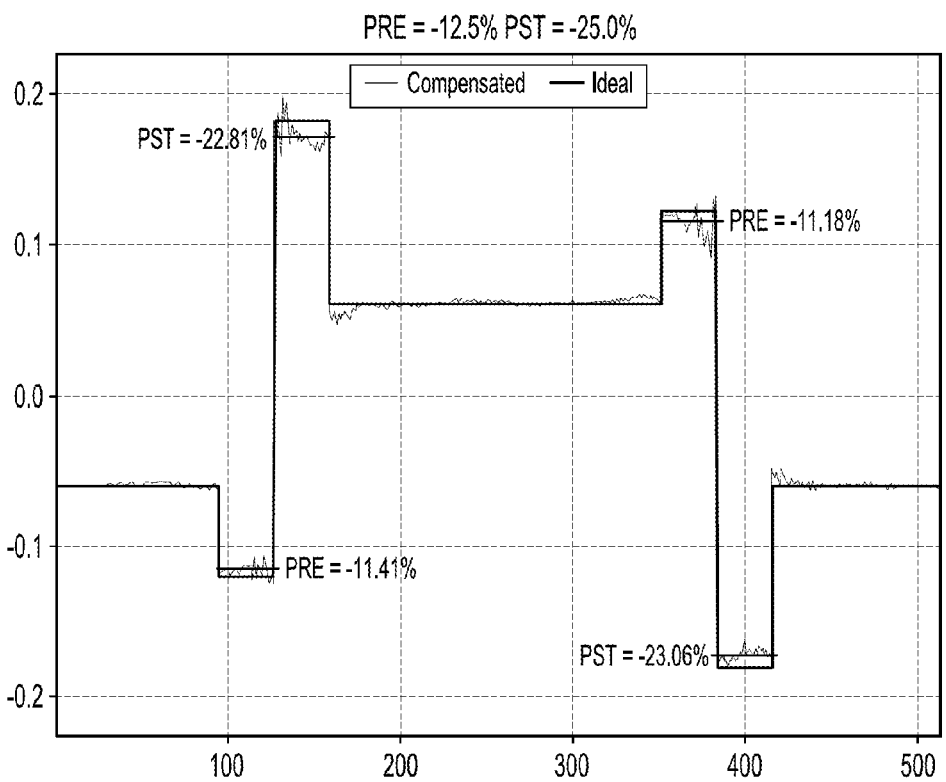
FIG. 8 is a plot of FIR compensated and ideal waveforms.

At operation 28, the measured, "idealistic," and ideal waveforms are superimposed onto one another according to user preference. With no FIR present, the "idealistic" and measured waveforms overlay each other as shown in FIG. 5. The transitional regions of the measured waveform extend across the neighboring bits. This is because the pre and post cursor tap values are zero, leaving only the cursor, which simply samples the measured waveform according to (1). FIG. 6 illustrates how the plot may appear for the case in which there is no FIR. The idealistic and measured waveforms overlay when compensated showing that they are the same. FIGS. 7 and 8 illustrate examples of how other plots with FIR may appear. The difference between the idealistic and measured waveforms reveals the FIR. Without computing the difference, erroneous values may be extracted for the FIR tap values as illustrated. The plot in this step can be scaled (transformed) to a FIR scale or to the measured volts scale. In FIGS. 5 through 8, the waveforms are aligned and displayed such that four "0's" are first, followed by eight "1's," then the remaining four "0's." In certain examples, the waveform alignment can be adjustable so that the user may change or correct it as desired.

At operation 30, the eight-ones-eight-zeros waveform is measured with FIR. That is, the eight-ones-eight-zeros waveform is transmitted through the transmitter circuit 14 including the FIR filter 16 with its pre and post cursor tap values set to the specified tap values, and the resulting output, $y_{[FIR]}$, is then captured.

At operation 32, the FIR compensation waveform, $y_{[compensated]}$, is calculated by taking the product of the waveform measured at operation 30 and the quotient of the ideal and "idealistic" waveforms. This can be realized by the linear algebra transformation $$y_{[compensated]} = \frac{y_{[ideal]}}{y_{[idealistic]}} x y_{[FIR]} \quad (9)$$

which projects the "idealistic" and ideal FIR waveforms onto the captured FIR waveform—thus removing the bandwidth components. This transforms the measured FIR waveform to the "ideal" vector space. (The "idealistic" and measured waveforms are in the same vector space. Hence, this is a valid way to transform the measured FIR to the "ideal" vector space.)

At operation 34, the compensated and ideal waveforms are superimposed on the same plot such that the FIR tap values of the compensated waveform and the FIR tap values of the ideal FIR waveform are aligned in time. This allows a direct comparison and extraction of the FIR tap values. FIG. 8 is an example of how the plots may appear. The compensated FIR is displayed with the ideal waveform. When compensated, effects of limited bandwidth are removed from the eight-ones-eight-zeroes pattern. This display can be scaled to a FIR scale or to the measured volts scale.

At operation 36, the FIR tap heights (cursor height optional) are extracted and displayed on the plots. Various known algorithms may be used and may vary depending on the user defined pattern sent. In the case of the eight-ones-eight-zeros pattern, the measurements are averaged in the regions where the taps manifest. Additionally, the swing height can be measured and displayed. Measurements of the swing height may become important since changes to the FIR taps directly affect the swing height. Current methods may specify only voltage peak-to-peak values with a specific FIR setting, which can be different depending on the circuit specifications.

At operation 38, operations 18 through 36 may be used to iteratively calculate the FIR tap values and the cursor value/swing height from the measured waveform. Under testing conditions, the FIR taps are known and a direct comparison of the measured values of the taps heights is typically most useful. There may be testing scenarios, however, in which the cursor height is not known. In such cases, the iterative process in this step will extract all the tap values. The iteration should have bounded values that are user defined and will select the values with the best fit for the FIR taps. Assuming user defined bounded values for the cursor of 0 and 1, for example, the pre-cursor tap and post-cursor tap values would be best fit adjusted against the measured waveform for each of the cursor values. The best fit waveform having the least error (least squared error) relative to the measured waveform yields the FIR tap values and the cursor value/swing height.

There may be several advantages to using the algorithms described above: (a) No S-parameter measurement is necessary. Instead, the signal of the system is used to compensate for the bandwidth. (b) There is no need for test structures since the measurements from the exact transmission lines are used. (c) An expected "idealistic" waveform is provided. (d) The FIR tap values for the rising and falling edges are provided. (e) Simple waveforms can be measured. Hence, these algorithms are not limited to large transitional waveform patterns, e.g. PRBS7. (f) These techniques can be used to accurately measure the swing of a waveform with FIR. Extreme FIR values distort the waveform such that simple voltage peak-to-peak measurements are either meaningless or invalid. These techniques can be used to correlate an ideal to the "idealistic" and measured waveforms to accurately extract meaningful swing values. (g) These algorithms may be fast since smaller patterns can be used instead of patterns with a larger number of transitional states. (h) The FIR may be plotted in easy to understand diagrams of the waveform pattern and the compensated waveform. Although the cursor and FIR taps should be known, they can be determined by running an iteration that finds the best fit for the FIR taps as mentioned with reference to operation 38.

The algorithms disclosed herein may facilitate two new displays: one for superimposed plots of the ideal, "idealistic," and measured FIR waveforms, and a second for superimposed plots of the compensated and ideal waveforms. These techniques may also provide useful information for FIR design and characterization, and provide means to extract FIR measurements without bandwidth limitation. These algorithms can be implemented into an existing scope's software to increase the measurement functionality and value of the scope.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many non-transitory forms (excluding signals) such as information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method for estimating finite impulse response (FIR) of a FIR filter, the method comprising:
by at least one controller,
injecting specified FIR tap values into a first captured waveform that results from transmitting a raw waveform through a transmitter circuit including the FIR filter having pre and post cursor tap values set to zero to create an expected waveform,
injecting the specified FIR tap values into the raw waveform to create an ideal waveform,
projecting the expected and ideal waveforms onto a second captured waveform that results from transmitting the ideal waveform through the transmitter circuit with the pre and post cursor tap values set to the specified FIR tap values to create a compensated waveform, and
extracting FIR tap values from the compensated waveform.

2. The method of claim 1 wherein extracting FIR tap values from the compensated waveform includes aligning the compensated and ideal waveforms in time.

3. The method of claim 1 wherein injecting specified FIR tap values into a first captured waveform includes convolving the specified FIR tap values and the first captured waveform.

4. The method of claim 1 wherein injecting the specified FIR tap values into the raw waveform includes convolving the FIR tap values and the raw waveform.

5. The method of claim 1 wherein projecting the expected and ideal waveforms onto a second captured waveform includes taking a product of the second captured waveform and a quotient of the ideal and expected waveforms.

6. The method of claim 1 further comprising extracting a cursor tap value from the second captured waveform.

7. The method of claim 1 wherein the raw waveform is a repeating waveform.

8. A finite impulse response (FIR) extractor comprising:
at least one controller programmed to
inject specified FIR tap values into a first captured waveform that results from transmitting a raw waveform through a transmitter circuit including a FIR filter having pre and post cursor tap values set to zero to create an expected waveform,
inject the specified FIR tap values into the raw waveform to create an ideal waveform,
project the expected and ideal waveforms onto a second captured waveform that results from transmitting the ideal waveform through the transmitter circuit with the pre and post cursor tap values set to the specified FIR tap values to create a compensated waveform, and
extract FIR tap values from the compensated waveform.

9. The extractor of claim 8 wherein extracting FIR tap values from the compensated waveform includes aligning the compensated and ideal waveforms in time.

10. The extractor of claim 8 wherein injecting specified FIR tap values into a first captured waveform includes convolving the specified FIR tap values and the first captured waveform.

11. The extractor of claim 8 wherein injecting the specified FIR tap values into the raw waveform includes convolving the FIR tap values and the raw waveform.

12. The extractor of claim 8 wherein projecting the expected and ideal waveforms onto a second captured waveform includes taking a product of the second captured waveform and a quotient of the ideal and expected waveforms.

13. The extractor of claim 8 wherein the at least one controller is further programmed to extract a cursor tap value from the second captured waveform.

14. The extractor of claim 8 wherein the at least one controller is further programmed to provide output indicative of the compensated and ideal waveforms for display.

15. The extractor of claim 8 wherein the raw waveform is a repeating waveform.

16. A non-transitory computer-readable storage medium having instructions stored thereon that, when executed by a processor, cause the processor to
- inject specified finite impulse response (FIR) tap values into a first captured waveform that results from transmitting a raw waveform through a transmitter circuit including a FIR filter having pre and post cursor tap values set to zero to create an expected waveform,
- inject the specified FIR tap values into the raw waveform to create an ideal waveform,
- project the expected and ideal waveforms onto a second captured waveform that results from transmitting the ideal waveform through the transmitter circuit with the pre and post cursor tap values set to the specified FIR tap values to create a compensated waveform, and
- extract FIR tap values from the compensated waveform.

17. The medium of claim 16 wherein extracting FIR tap values from the compensated waveform further includes aligning the compensated and ideal waveforms in time.

18. The medium of claim 16 wherein injecting specified FIR tap values into a first captured waveform includes convolving the specified FIR tap values and the first captured waveform.

19. The medium of claim 16 wherein injecting the specified FIR tap values into the raw waveform includes convolving the FIR tap values and the raw waveform.

20. The medium of claim 16 wherein projecting the expected and ideal waveforms onto a second captured waveform includes taking a product of the second captured waveform and a quotient of the ideal and expected waveforms.

* * * * *

UNITED STATES PATENT AND TRADEMARK OFFICE
CERTIFICATE OF CORRECTION

PATENT NO. : 9,077,316 B2
APPLICATION NO. : 13/716840
DATED : July 7, 2015
INVENTOR(S) : Frei et al.

Page 1 of 1

It is certified that error appears in the above-identified patent and that said Letters Patent is hereby corrected as shown below:

In the specification,

In column 2, line 60, delete "$h=\delta\cdot pre_{x-1}+\ldots+\delta\cdot pre_1+\delta\cdot cur+\delta pst_{x-1}+\ldots+\delta\cdot pst_x$" and insert -- $h = \delta \cdot pre_x + \delta \cdot pre_{x-1} + \ldots + \delta \cdot pre_1 + \delta \cdot cur + \delta \cdot pst_1 + \ldots + \delta \cdot pst_{x-1} + \delta \cdot pst_x$ --, therefor.

Signed and Sealed this
Eighth Day of March, 2016

Michelle K. Lee
*Director of the United States Patent and Trademark Office*